(12) United States Patent
Jojima

(10) Patent No.: US 8,893,522 B2
(45) Date of Patent: Nov. 25, 2014

(54) COOLING DEVICE

(75) Inventor: Yuki Jojima, Nagoya (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/979,258

(22) PCT Filed: Feb. 4, 2011

(86) PCT No.: PCT/JP2011/052387
§ 371 (c)(1),
(2), (4) Date: Jul. 11, 2013

(87) PCT Pub. No.: WO2012/105047
PCT Pub. Date: Aug. 9, 2012

(65) Prior Publication Data
US 2013/0298588 A1 Nov. 14, 2013

(51) Int. Cl.
*F25D 23/12* (2006.01)
*H05K 7/20* (2006.01)
*H02J 7/00* (2006.01)
*B60H 1/32* (2006.01)
*B60L 11/18* (2006.01)
*B60H 1/00* (2006.01)
*H01M 10/46* (2006.01)

(52) U.S. Cl.
CPC ..... *H05K 7/20354* (2013.01); *F25B 2400/0403* (2013.01); *Y02T 10/7005* (2013.01); *F25B 2500/18* (2013.01); *Y02T 90/14* (2013.01); *H02J 7/00* (2013.01); *Y02T 10/7088* (2013.01); *B60H 1/32* (2013.01); *B60H 1/00271* (2013.01); *B60L 11/1812* (2013.01); *H01M 10/46* (2013.01); *Y02T 90/127* (2013.01); *H01M 2220/20* (2013.01); *F25B 2600/2501* (2013.01)

USPC .......................................... 62/259.2; 62/498

(58) Field of Classification Search
CPC .. B60H 1/32; B60H 1/00271; B60L 11/1812; F25B 2500/18; F25B 2400/0403; F25B 2600/2501; H01M 2220/20; H01M 10/46; Y02T 10/7005; Y02T 10/7088; Y02T 90/14; H02J 7/00
USPC ............. 62/259.2, 498, 324.6, 185, 434, 239, 62/503, 513
See application file for complete search history.

(56) References Cited
U.S. PATENT DOCUMENTS 4,341,086 A * 7/1982 Ishii ................................ 62/225
5,371,454 A * 12/1994 Marek .......................... 320/108
(Continued)

FOREIGN PATENT DOCUMENTS

JP A-4-93557 3/1992
JP A-4-275492 10/1992
(Continued)

*Primary Examiner* — Mohammad M Ali
(74) *Attorney, Agent, or Firm* — Oliff PLC

(57) ABSTRACT

A cooling device for a charger capable of simplifying the device configuration and reducing the power consumption is provided. Cooling device for cooling the charger for charging a battery with use of power supply received from a power source includes a compressor for circulating a cooling agent, a condenser for condensing the cooling agent, a decompressor for decompressing the cooling agent condensed by condenser, an evaporator for evaporating the cooling agent decompressed by the decompressor, and a cooling portion for cooling the charger with use of the cooling agent flowing from the condenser, and the cooling portion is provided on a path of the cooling agent flowing from the condenser to the evaporator.

9 Claims, 10 Drawing Sheets

(56) References Cited

U.S. PATENT DOCUMENTS

| | | | |
|---|---|---|---|
| 6,106,972 | A | 8/2000 | Kokubo et al. |
| 7,228,692 | B2* | 6/2007 | Concha et al. ................... 62/151 |
| 7,370,493 | B2* | 5/2008 | Suzuki et al. ................... 62/513 |
| 7,690,219 | B2* | 4/2010 | Suzuki et al. ................... 62/512 |
| 8,166,774 | B2* | 5/2012 | Obrist et al. ..................... 62/402 |
| 2003/0154735 | A1* | 8/2003 | Wurth ........................... 62/259.2 |
| 2003/0159455 | A1* | 8/2003 | Aikawa et al. .................. 62/225 |
| 2004/0172958 | A1* | 9/2004 | Ito et al. ........................... 62/222 |
| 2005/0279127 | A1* | 12/2005 | Jia et al. .......................... 62/510 |
| 2006/0023480 | A1* | 2/2006 | Plummer ....................... 363/146 |
| 2006/0137385 | A1* | 6/2006 | Take et al. ........................ 62/498 |
| 2006/0213220 | A1* | 9/2006 | Takahashi et al. .............. 62/503 |
| 2007/0204637 | A1* | 9/2007 | Fujii et al. ........................ 62/185 |
| 2007/0215589 | A1* | 9/2007 | Berger .......................... 219/202 |
| 2007/0266964 | A1* | 11/2007 | Soderberg ................... 123/41.11 |
| 2008/0184732 | A1* | 8/2008 | Hadler et al. .................... 62/503 |
| 2013/0157089 | A1* | 6/2013 | Miyatake et al. ................ 429/72 |

FOREIGN PATENT DOCUMENTS

| | | |
|---|---|---|
| JP | U-04-120577 | 10/1992 |
| JP | A-7-280362 | 10/1995 |
| JP | A-7-312805 | 11/1995 |
| JP | A-11-26031 | 1/1999 |
| JP | A-2000-73763 | 3/2000 |
| JP | A-2001-309506 | 11/2001 |
| JP | A-2005-90862 | 4/2005 |
| JP | A-2007-69733 | 3/2007 |
| JP | A-2010-280352 | 12/2010 |

* cited by examiner

COOLING DEVICE

TECHNICAL FIELD

The present invention relates to a cooling device, and more particularly to a cooling device for cooling a charger for charging a battery using a vapor compression refrigeration cycle.

BACKGROUND ART

In recent years, as one of countermeasures with respect to an environmental problem, a hybrid vehicle, a fuel cell vehicle, an electric vehicle, and the like running with a drive force of a motor attract attention. In such vehicles, electric equipment such as a motor, a generator, an inverter, a converter, and a battery generate heat due to supply and reception of power. Therefore, these electric equipment need to be cooled.

Japanese Patent Laying-Open No. 2000-73763 (PTD 1) discloses a cooling device for a hybrid vehicle. The cooling device includes a first cooling circuit for cooling an engine cylinder head and a driving motor selectively or concurrently, a second cooling circuit for cooling an engine cylinder block, and a third cooling circuit for cooling a power electric control unit for performing a drive control to the driving motor.

According to the cooling device disclosed in Japanese Patent Laying-Open No. 2000-73763 (PTD 1), a system for circulating cooling water is used between a heat-generating body and a radiator is used to cool electric parts, like a usual vehicle cooling only an engine. Such a system needs a radiator for cooling electric parts to be newly provided, causing a problem of low vehicle-mountability.

In view of the above, there has been proposed a technology of cooling a heat generating body by utilizing a vapor compression refrigeration cycle used as a vehicle air-conditioning device. For example, Japanese Patent Laying-Open No. 2007-69733 (PTD 2) discloses a system for cooling a heat generating body utilizing a cooling agent for an air conditioning device. In the system, a heat exchanger for performing a heat exchange with air for air-conditioning and a heat exchanger for performing a heat exchange with a heat-generating body are arranged in parallel on a cooling agent passage extending from an expansion valve to a compressor.

Japanese Patent Laying-Open No. 2005-90862 (PTD 3) discloses a cooling system. In the cooling system, heat-generating body cooling means for cooling a heat-generating body is provided on a bypass passage bypassing a decompressor, an evaporator, and a compressor of a refrigeration cycle for air-conditioning. Japanese Patent Laying-Open No, 2001-309506 (PTD 4) discloses a cooling system. In the cooling system, a cooling agent of a vehicle air-conditioning refrigeration cycle device is circulated to a cooling member of an inverter circuit portion for performing a drive control to a vehicle running motor to suppress cooling of air-conditioning air flow by an evaporator of a vehicle air-conditioning refrigeration cycle device when cooling of the air-conditioning air flow is not necessary.

On the other hand, various technologies for cooling a charger mounted on a vehicle have been proposed conventionally. For example, Japanese Patent Laying-Open No. 4-275492 (PTD 5) discloses a cooling device. According to the disclosure, a charger for rectifying power supplied from a power source to charge a battery is provided in an electric vehicle, and a cooling liquid circulating path is piped so as to go through the charger, and a cooling liquid pump circulates cooling liquid present in the cooling liquid circulating path. Japanese Patent Laying-Open No. 7-312805 (PTD 6) discloses a device, in which both ends of a circulating pipe for circulating cooling fluid are connected to a main body casing of a vehicle-mounted charger, and an electric pump motor for circulating the cooling fluid in the circulating pipe is provided, and a radiator for cooling the cooling fluid is also provided.

CITATION LIST

Patent Document

PTD 1: Japanese Patent Laying-Open No. 2000-73763
PTD 2: Japanese Patent Laying-Open No. 2007-69733
PTD 3: Japanese Patent Laying-Open No. 2005-90862
PTD 4: Japanese Patent Laying-Open No. 2001-309506
PTD 5: Japanese Patent Laying-Open No. 4-275492
PTD 6: Japanese Patent Laying-Open No. 7-312805

SUMMARY OF INVENTION

Technical Problem

According to the cooling devices disclosed in Japanese Patent Laying-Open No. 4-275492 (PTD 5) and Japanese Patent Laying-Open No. 7-312805 (PTD 6), since a dedicated pump needs to be provided as a power source for circulating cooling fluid to cool a charger, a device configuration becomes complex, and the cost for the device increases additionally.

In recent years, an electric vehicle capable of charging a battery (lithium-ion secondary battery) mounted on a vehicle with use of power supply received from an external power source of a vehicle is now under development for a practical use. Such a vehicle includes a PHV (Plug-in Hybrid Vehicle) and an EV (Electric Vehicle). The charging time for this case is about 8 hours with use of 100V power source and about 4 hours even with use of 200V power source, requiring a long period of time. According to the cooling devices disclosed in Japanese Patent Laying-Open No. 4-275492 (PTD 5) and Japanese Patent Laying-Open No. 7-312805 (PTD 6), during the charging for a long period of time, the pump needs to keep driving to circulate the cooling fluid. Therefore, the power consumption in the pump increases, and also shortening in life duration of the pump are concerned.

The present invention was achieved in context of the problems described above, and its main object is to provide a cooling device for a charger capable of achieving a simple device configuration and reduced power consumption.

Solution to Problem

A cooling device according to the present invention is a cooling device for cooling a charger for charging a battery with use of power supply received from a power source, including a compressor for circulating a cooling agent, a condenser for condensing the cooling agent, a decompressor for decompressing the cooling agent condensed by the condenser, an evaporator for evaporating the cooling agent decompressed by the decompressor, a cooling portion for cooling the charger with use of the cooling agent flowing from the condenser, the cooling portion being provided on a path of the cooling agent flowing from the condenser to the decompressor; and a communication passage for allowing communication between a path of the cooling agent flowing from the cooling portion to the decompressor and a path of the cooling agent flowing from the compressor to the condenser. The cooling portion is arranged below the condenser.

In the cooling device, the charger may come in direct contact with a pipe allowing the cooling agent to flow. Further, the cooling device may include a heat pipe arranged between the charger and the pipe allowing the cooling agent to flow.

Preferably, in the cooling device, another condenser may be provided on a path of the cooling agent flowing from the cooling portion to the decompressor. In this case, the condenser may have a higher heat radiating ability of radiating heat from the cooling agent than that of the another condenser. More preferably, the cooling device may include a first passage and a second passage arranged in parallel allowing the cooling agent to flow from an outlet of the condenser to an inlet of the decompressor, and the cooling portion may be provided on the second passage. In this case, the cooling device may include a flow rate adjusting valve arranged on the first passage to adjust a flow rate of the cooling agent flowing through the first passage and a flow rate of the cooling agent flowing through the second passage.

The cooling device may include a switching valve for switching a flow of the cooling agent from an outlet of the cooling portion to an inlet of the decompressor, and a flow of the cooling agent from the outlet of the cooling portion to the communication passage.

Preferably, in the cooling device, the cooling portion may include electric equipment arranged on an upstream side from the charger on the flow of the cooling agent, and the cooling portion uses the cooling agent flowing from the condenser to cool the electric equipment.

Advantageous Effects of Invention

According to the cooling device of the present invention, the device configuration can be simplified, and the power consumption can be reduced.

DESCRIPTION OF EMBODIMENTS

Figure 1:
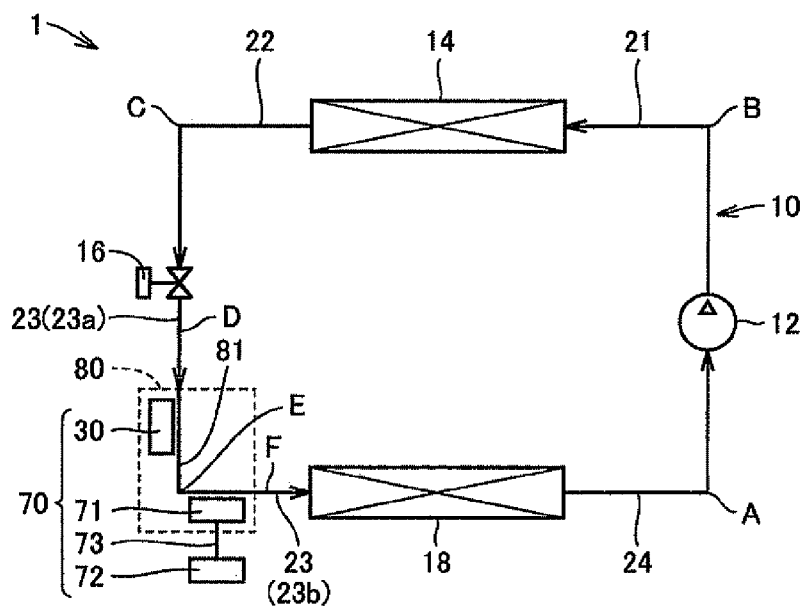
FIG. 1 schematically represents a configuration of a cooling device of a first embodiment.

Hereinafter, embodiments of the present invention will be described with reference to the drawings. In the drawings below, the same or corresponding parts have the same reference numerals allotted, and description of those will not be repeated.

First Embodiment

FIG. 1 schematically represents a configuration of a cooling device 1 of a first embodiment. As shown in FIG. 1, cooling device 1 includes a vapor compression refrigeration cycle 10. Vapor compression refrigeration cycle 10 is mounted on a vehicle, for example, to perform cooling for a vehicle cabin. The cooling with use of vapor compression refrigeration cycle 10 is performed, for example, when a switch for performing cooling is turned on, or when an automatic control mode for adjusting a temperature in the vehicle cabin automatically to a set temperature is selected and the temperature in the vehicle cabin is higher than the set temperature.

Vapor compression refrigeration cycle 10 includes a compressor 12, a condenser 14, an expansion valve 16 as an example of a decompressor, and an evaporator 18. Vapor compression refrigeration cycle 10 further includes a cooling agent passage 21 allowing communication between compressor 12 and condenser 14, a cooling agent passage 22 allowing communication between condenser 14 and expansion valve 16, a cooling agent passage 23 allowing communication between expansion valve 16 and evaporator 18, and a cooling agent passage 24 allowing communication between evaporator 18 and compressor 12. Vapor compression refrigeration cycle 10 is configured such that compressor 12, condenser 14, expansion valve 16, and evaporator 18 are coupled by cooling agent passages 21-24.

Compressor 12 is operated by a motor or an engine mounted on a vehicle as a power source and obtains a superheated gaseous cooling agent by adiabatically compressing the cooling agent gas. Compressor 12 takes in and compresses a gas phase cooling agent flowing from evaporator 18 via cooling agent passage 24 during operation, and then discharges the cooling agent to cooling agent passage 21. Compressor 12 discharges the cooling agent to cooling agent passage 21 to allow circulation of the cooling agent in vapor compression refrigeration cycle 10.

Condenser 14 allows superheated gaseous cooling agent compressed by compressor 12 to radiate heat isobarically to an external medium to obtain cooling agent liquid. The gas phase cooling agent discharged from compressor 12 is condensed (liquefied) by radiating heat to a periphery of condenser 14 for cooling. Condenser 14 includes a tube for allowing the cooling agent to flow, and a fin for performing a heat exchange between the cooling agent flowing in the tube and air around condenser 14. Condenser 14 performs the heat exchange between cooling wind supplied by natural draft generated by running of a vehicle and the cooling agent. The heat exchange performed in condenser 14 lowers the temperature of the cooling agent and liquefies the cooling agent.

Expansion valve 16 allows the high-pressure liquid phase cooling agent flowing through cooling agent passage 22 to be sprayed from a small pore for expansion to obtain a low-temperature, low-pressure mist-like cooling agent. Expansion valve 16 decompresses the cooling agent liquid condensed by condenser 14 to obtain moist vapor in a gas-liquid mixed state. The decompressor for decompressing the cooling agent liquid flowing through cooling agent passage 22 is not limited to expansion valve 16 performing throttle expansion but may be a capillary tube.

Evaporator 18 absorbs heat of ambient air introduced so as to come in contact with evaporator by the evaporation of the mist-like cooling agent flowing therethrough. Evaporator 18 uses the cooling agent decompressed by expansion valve 16 to absorb heat of evaporation, required when the moist vapor of the cooling agent is evaporated to become cooling agent gas, from air in the vehicle cabin as a cooled portion, so that cooling in the vehicle cabin is performed. The air with a temperature lowered due to absorption of heat by evaporator 18 is returned again into the vehicle cabin, so that cooling in the vehicle cabin is performed. The cooling agent is heated by taking heat from a periphery in evaporator 18.

Evaporator 18 includes a tube for allowing the cooling agent to flow, and a fin for performing a heat exchange between the cooling agent flowing in the tube and ambient air of evaporator 18. The cooling agent in the state of moist vapor flows in the tube. The cooling agent, when flowing through the tube, is evaporated by absorbing heat of air in the vehicle cabin via the fin as latent heat of evaporation, and further becomes superheated vapor by absorbing sensible heat. The evaporated cooling agent flows to compressor 12 via cooling agent passage 24. Compressor 12 compresses the cooling agent flowing from evaporator 18.

Cooling agent passage 21 is a passage for allowing the cooling agent to flow from compressor 12 to condenser 14. The cooling agent flows from an outlet of compressor 12 to an inlet of condenser 14 via cooling agent passage 21. Cooling agent passage 22 is a passage for allowing the cooling agent to flow from condenser 14 to expansion valve 16. The cooling agent flows from an outlet of condenser 14 to an inlet of expansion valve 16 via cooling agent passage 22. Cooling agent passage 23 is a passage for allowing the cooling agent to flow from expansion valve 16 to evaporator 18. The cooling agent flows from an outlet of expansion valve 16 to an inlet of evaporator 18 via cooling agent passage 23. Cooling agent passage 24 is a passage for allowing the cooling agent to flow from evaporator 18 to compressor 12. The cooling agent flows from an outlet of evaporator 18 to an inlet of compressor 12 via cooling agent passage 24.

The cooling agent flows in vapor compression refrigeration cycle 10 so as to pass through the points A, B, C, D, E, and F shown in FIG. 1 sequentially, and the cooling agent circulates through compressor 12, condenser 14, expansion valve 16, and evaporator 18. The cooling agent passes through a cooling agent circulating flow passage including compressor 12, condenser 14, expansion valve 16, and evaporator 18 sequentially connected by cooling agent passages 21-24, and circulates in vapor compression refrigeration cycle 10.

As the cooling agent for vapor compression refrigeration cycle 10, carbon dioxide, carbon hydride such as propane and isobutane, ammonium, or water can be employed, for example.

On cooling agent passage 23 allowing the cooling agent to flow from expansion valve 16 to evaporator 18, a cooling portion 80 is provided. Cooling portion 80 is provided on a path of the cooling agent flowing from expansion valve 16 to evaporator 18. Since cooling portion 80 is provided, cooling agent passage 23 is divided into a cooling agent passage 23a provided on an upstream side from cooling portion 80 (side close to expansion valve 16) and a cooling agent passage 23b provided on a downstream side from cooling portion 80 (side close to evaporator 18). Cooling portion 80 uses the low-temperature, low-pressure cooling agent left from condenser 14 and decompressed at expansion valve 16 to cool charger 71.

Cooling portion 80 includes an HV (Hybrid Vehicle) equipment heat source 30 and charger 71, being electric equipment mounted on a vehicle, as well as a cooling passage 81 being a pipe allowing the cooling agent to flow. HV equipment heat source 30 and charger 71 are examples of a heat source. The cooling agent left from expansion valve 16 and flowing through cooling agent passage 23a flows in cooling passage 81 and reaches evaporator 18 via cooling agent passage 23b. An end portion on an upstream side of cooling passage 81 is connected to cooling agent passage 23a. An end portion on a downstream side of cooling passage 81 is connected to cooling agent passage 23b. Cooling agent passage 23a is a passage for allowing the cooling agent to flow from expansion valve 16 to cooling portion 80. Cooling agent passage 23b is a passage for allowing the cooling agent to flow from cooling portion 80 to evaporator 18. The cooling agent flows from expansion valve 16 to cooling portion 80 via cooling agent passage 23a and flows from cooling portion 80 to evaporator 18 via cooling agent passage 23b.

The cooling agent flowing from condenser 14 to cooling portion 80 via expansion valve 16 and flowing via cooling passage 81 takes heat from HV equipment heat source 30 and charger 71 to cool HV equipment heat source 30 and charger 71. Cooling portion 80 is provided to have a structure capable of performing a heat exchange between HV equipment heat source 30 as well as charger 71 and the cooling agent through cooling passage 81. In the present embodiment, cooling portion 80 has, for example, cooling passage 81 formed so that an outer peripheral surface of cooling passage 81 comes in direct contact with housings of HV equipment heat source 30 and charger 71. Cooling passage 81 has portions being adjacent to respective housings of HV equipment heat source 30 and charger 71. At these portions, a heat exchange can be performed between the cooling agent flowing through cooling passage 81 and HV equipment heat source 30 as well as charger 71.

HV equipment heat source 30 includes electric equipment generating heat due to supply and reception of power. Electric equipment includes, for example, at least any one of an inverter for converting direct current power to alternate current power, a motor generator as a rotating electric machine, a battery as a power storage device, a converter for boosting the voltage of the battery, a DC/DC converter for stepping down the voltage of the battery. The battery is, for example, a secondary battery such as a lithium ion battery or a nickel-metal hydride battery. In place of the battery, a capacitor may be employed.

Charger 71 is electrically connected via a wiring 73 to a battery 72 capable of charging and discharging. Charger 71 includes a switching element for power conversion and converts power supplied from an external power source into a predetermined charging voltage (direct current). Power converted in its voltage by charger 71 is supplied to battery 72 to charge battery 72.

Figure 2:
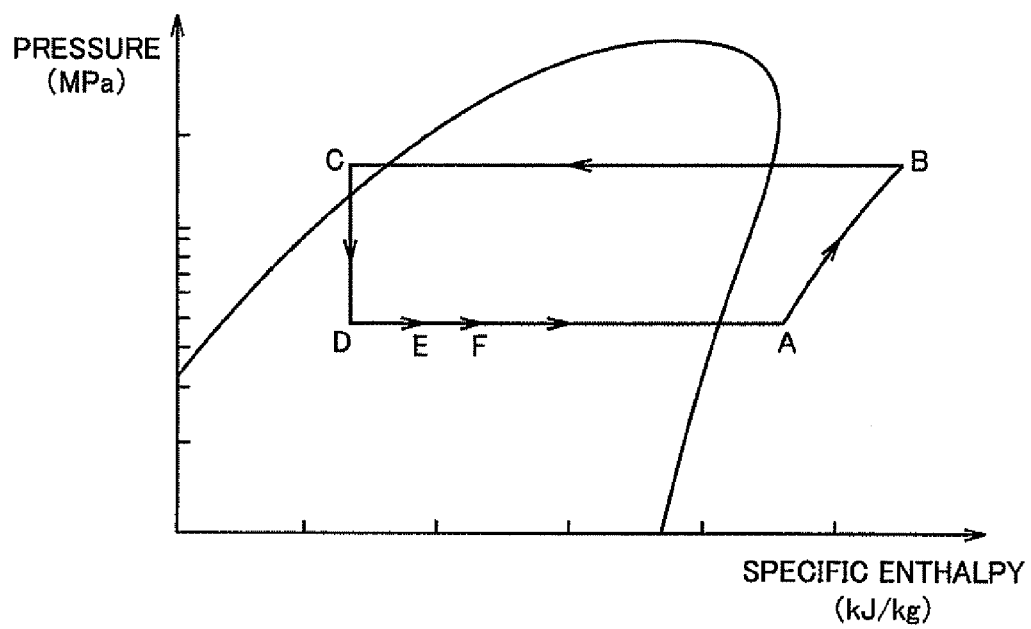
FIG. 2 represents a Mollier chart showing a condition of a cooling agent for a vapor compression refrigeration cycle of the first embodiment.

FIG. 2 represents a Mollier chart showing a state of the cooling agent of vapor compression refrigeration cycle 10 of the first embodiment. The horizontal axis in FIG. 2 denotes a specific enthalpy (unit: kJ/kg) of the cooling agent, and the vertical axis denotes an absolute pressure (unit: MPa) of the cooling agent. The curve shown in the drawing is a saturated vapor line as well as a saturated liquid line of the cooling agent. FIG. 2 represents a thermal dynamic state of the cooling agent at each point (in other words, the points A, B, C, D, E and F) in vapor compression refrigeration cycle 10 shown in FIG. 1 flowing from compressor 12 into cooling agent passage 23a via condenser 14 and expansion valve 16, cooling HV equipment heat source 30 and charger 71, and returning from cooling agent passage 23b to compressor 12 via evaporator 18.

As shown in FIG. 2, the cooling agent in the superheated gaseous state taken into compressor 12 (point A) is adiabatically compressed along an isentropic line in compressor 12. As the compression is performed, the cooling agent rises in pressure and temperature, becomes high-temperature, high-pressure superheated vapor with a high degree of superheat (point B), and flows into condenser 14. The high-pressure cooling agent vapor having entered into condenser 14 is cooled at condenser 14, becomes dry saturated vapor from superheated vapor while maintaining equal pressure, radiates latent heat of condensation and is gradually liquefied to become moist vapor in the gas-liquid mixed state, becomes saturated liquid after all of the cooling agent is condensed, and further radiates sensible heat to become supercooled liquid (point C).

Thereafter, the cooling agent flows into expansion valve 16. At expansion valve 16, the cooling agent in the state of supercooled liquid is subjected to throttle expansion, and the temperature and pressure are lowered without change in a specific enthalpy, so that low-temperature, low-pressure moist vapor in the gas-liquid mixed state is obtained (point D).

The cooling agent in the state of moist vapor left from expansion valve 16 flows into cooling passage 81 of cooling portion 80 via cooling agent passage 23a to cool HV equipment heat source 30 and charger 71. The heat exchange with HV equipment heat source 30 and charger 71 reduces a dryness of the cooling agent. In other words, in the moist vapor state having two-phase flows with a mixture of saturated liquid and dried saturated vapor, the saturated liquid is evaporated and reduced, and the vaporized saturated liquid becomes dry saturated vapor, so that more dry saturated vapor is present. Cooling HV equipment heat source 30 causes a part of the cooling agent to be evaporated (point E), and cooling charger 71 causes a part of the cooling agent to be further evaporated (point F).

Thereafter, the cooling agent absorbs heat from outside and is evaporated at equal pressure by latent heat of evaporation in evaporator 18. When all the cooling agent becomes dry saturated vapor, the cooling agent vapor is raised in temperature by sensible heat, so that the cooling agent becomes superheated vapor (point A) and is absorbed by compressor 12. In accordance with such cycle, the cooling agent consecutively repeats the state changes of compression, condensing, throttle expansion, and evaporation.

In the description of the vapor compression refrigeration cycle above, the theoretical refrigeration cycle is described. However, in actual vapor compression refrigeration cycle 10, loss in compressor 12 and pressure loss as well as heat loss in the cooling agent should be taken into consideration.

During a driven state of vapor compression refrigeration cycle 10, the cooling agent absorbs heat of vaporization from air inside the vehicle cabin at evaporator 18 to perform cooling in the vehicle cabin. Additionally, the cooling agent performs a heat exchange with HV equipment heat source 30 and charger 71 to cool HV equipment heat source 30 and charger 71. Cooling device 1 cools HV equipment heat source 30 and charger 71 as heat sources mounted on a vehicle using vapor compression refrigeration cycle 10 for air-conditioning in the vehicle cabin. The temperature required for cooling HV equipment heat source 30 and charger 71 is preferably at least a temperature lower than an upper limit value of a target temperature range as a temperature range of HV equipment heat source 30 and charger 71.

As described above, in cooling device 1 of the present embodiment, vapor compression refrigeration cycle 10 provided to cool the cooled portion in evaporator 18 is utilized to perform cooling of charger 71. There is no need to provide equipment such as a dedicated water circulating pump or a cooling fan for the cooling of charger 71. Therefore, since the configuration required for cooling device 1 of charger 71 can be reduced, and the device configuration can be simplified, the production cost for cooling device 1 can be reduced. Additionally, since there is no need to drive a power source such as a pump and a cooling fan for cooling charger 71, the power consumption for driving the power source is not required. Therefore, the power consumption for cooling charger 71 can be reduced.

Charger 71 is directly connected to an outer peripheral surface of cooling passage 81 forming a part of a path of the cooling agent extending from condenser 14 to evaporator 18 of vapor compression refrigeration cycle 10, and is cooled. Since charger 71 is arranged outside of cooling passage 81, charger 71 does not interfere with a flow of the cooling agent flowing in cooling passage 81. Therefore, since the pressure loss of vapor compression refrigeration cycle 10 does not increase, charger 71 can be cooled without increasing the power of compressor 12.

In cooling portion 80, HV equipment heat source 30 is arranged on an upstream side of the flow of the cooling agent, and charger 71 is arranged on a downstream side. HV equipment heat source 30 is arranged on an upstream side from charger 71 along the flow of the cooling agent. The cooling agent is heated by receiving heat from HV equipment heat source 30 and charger 71 sequentially. Charger 71 is cooled by the cooling agent heated by a heat exchange with HV equipment heat source 30. Comparing the dryness of the cooling agent for cooling HV equipment heat source 30 and the dryness of the cooling agent for cooling charger 71, the dryness of the cooling agent for cooling charger 71 arranged on a downstream side is greater.

As described above, when charger 71 is arranged on a downstream side with respect to HV equipment heat source 30, a heat radiating ability of the cooling agent for cooling HV equipment heat source 30 becomes relatively higher, so that HV equipment heat source 30 can be cooled reliably. HV equipment heat source 30 is equipment necessary for driving of a vehicle. When HV equipment heat source 30 fails due to insufficient cooling, driving of the vehicle cannot be performed. Due to HV equipment heat source 30 requiring more cooling being arranged on an upstream side to be cooled reliably, HV equipment heat source 30 can be made less susceptible to breakdown in a case where the cooling agent is vaporized for some reason to cause lowering in the cooling ability. Therefore, reliability of the vehicle can be improved.

Second Embodiment

Figure 3:
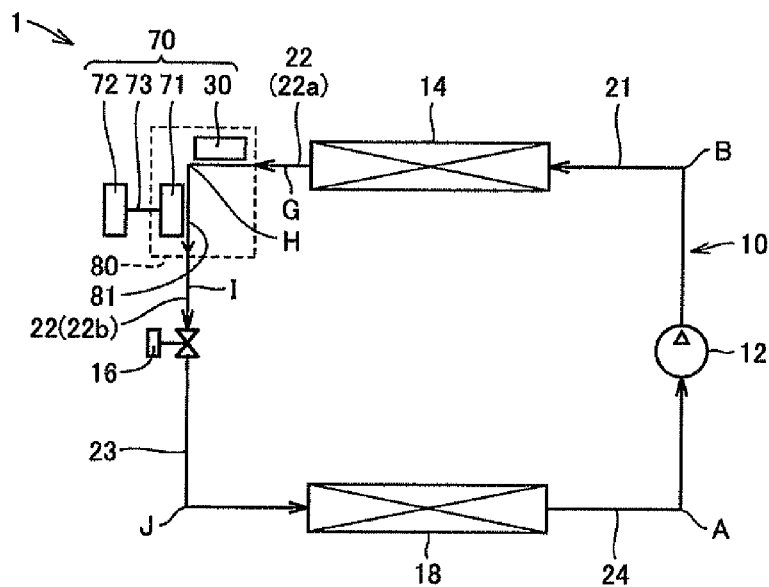
FIG. 3 schematically represents a configuration of a cooling device of a second embodiment.

FIG. 3 schematically represents a configuration of cooling device 1 of a second embodiment. In the first embodiment, cooling portion 80 is provided on cooling agent passage 23 between expansion valve 16 and evaporator 18. On the other hand, in cooling device 1 of the second embodiment, cooling portion 80 is provided on cooling agent passage 22 as a path of the cooling agent flowing from condenser 14 to expansion valve 16. Since cooling portion 80 is provided, cooling agent passage 22 is divided into cooling agent passage 22a provided on an upstream side from cooling portion 80 (side close to condenser 14) and a cooling agent passage 22b provided on a downstream side from cooling portion 80 (side close to expansion valve 16).

Figure 4:
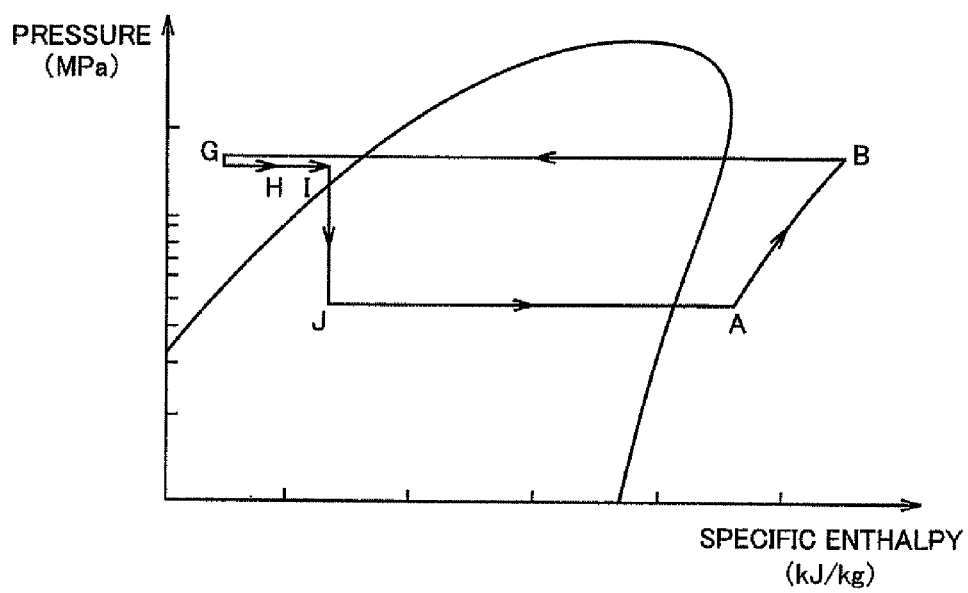
FIG. 4 represents a Mollier chart showing a condition of a cooling agent for a vapor compression refrigeration cycle of the second embodiment.

FIG. 4 represents a Mollier chart showing a state of the cooling agent of vapor compression refrigeration cycle of the second embodiment. The horizontal axis in FIG. 4 denotes a specific enthalpy (unit: kJ/kg) of the cooling agent, and the vertical axis denotes an absolute pressure (unit: MPa) of the cooling agent. The curve shown in the drawing is a saturated vapor line as well as a saturated liquid line of the cooling agent.

FIG. 4 represents a thermal dynamic state of the cooling agent at each point (in other words, the points A, B, G, H, I, and J) in vapor compression refrigeration cycle 10 shown in FIG. 3.

As shown in FIG. 4, the cooling agent in the superheated gaseous state taken into compressor 12 (point A) is adiabatically compressed along an isentropic line in compressor 12. As the compression is performed, the cooling agent rises in pressure and temperature, becomes high-temperature, high-pressure superheated vapor with a high degree of superheat (B point), and flows into condenser 14. The high-pressure cooling agent vapor having entered into condenser 14 is cooled at condenser 14, becomes dry saturated vapor from superheated vapor while maintaining equal pressure, radiates latent heat of condensation and is gradually liquefied to become moist vapor in the gas-liquid mixed state, becomes saturated liquid after all of the cooling agent is condensed, and further radiates sensible heat to become supercooled liquid (point G).

The liquefied cooling agent flows from the point G into cooling passage 81 of cooling portion 80 via cooling agent passage 22a to cool HV equipment heat source 30 and charger 71. Performing a heat exchange with HV equipment heat source 30 causes the degree of supercool of the cooling agent to be small, so that the temperature of the cooling agent in the state of supercooled liquid rises (point H). Thereafter, performing the heat exchange with charger 71 causes the degree of supercool of the cooling agent to be smaller so as to be close to the saturated temperature of the liquid cooling agent (point I).

Thereafter, the cooling agent flows into expansion valve 16. At expansion valve 16, the cooling agent in the state of supercooled liquid is subjected to throttle expansion, and the temperature and pressure are lowered without change in a specific enthalpy, so that low-temperature, low-pressure moist vapor in the gas-liquid mixed state is obtained (J point). The cooling agent in the state of moist vapor left from expansion valve 16, in evaporator 18, absorbs heat from outside and is evaporated by latent heat of vaporization while maintaining the equal pressure. When all the cooling agent becomes dry saturated vapor, the cooling agent vapor further rises in its temperature by sensible heat, becomes superheated vapor (point A), and is taken in by compressor 12.

The cooling agent is cooled until it becomes supercooled liquid in condenser 14 and is heated to a temperature slightly below the saturated temperature with sensible heat received from HV equipment heat source 30 and charger 71. Thereafter, the cooling agent passes through expansion valve 16 to become low-temperature, low-pressure moist vapor. At an outlet of expansion valve 16, the cooling agent has a temperature and a pressure originally required for cooling of the vehicle cabin. Condenser 14 has a heat radiating ability to an extent of sufficiently cooling the cooling agent.

When the low-temperature, low-pressure cooling agent which has passed through expansion valve 16 is used for cooling charger 71, an ability for cooling air in the cabin by evaporator 18 is lowered, so that the ability for cooling the cabin is lowered. On the other hand, in cooling device 1 of the present embodiment, the cooling agent is cooled down to a sufficiently supercooled state in condenser 14, and the high pressure cooling agent at an outlet of condenser 14 is used for cooling charger 71. Therefore, charger 71 can be cooled without affecting the ability for cooling air in the vehicle cabin.

The specification of condenser 14 (in other words, the size or heat radiation ability of condenser 14) is determined such that the temperature of the liquid-phase cooling agent after passing through condenser 14 is lower than the temperature necessary for cooling the cabin. The specification of condenser 14 is determined such that a heat radiation amount is greater by the amount of heat assumed to be received by the cooling agent from HV equipment heat source 30 and charger 71 than the condenser of the vapor compression refrigeration cycle in the case of not cooling HV equipment heat source 30 and charger 71. Cooling device 1 including condenser 14 having such a specification can cool charger 71 appropriately without increasing the power of compressor 12 while maintaining the ability for cooling the vehicle cabin.

Third Embodiment

Figure 5:
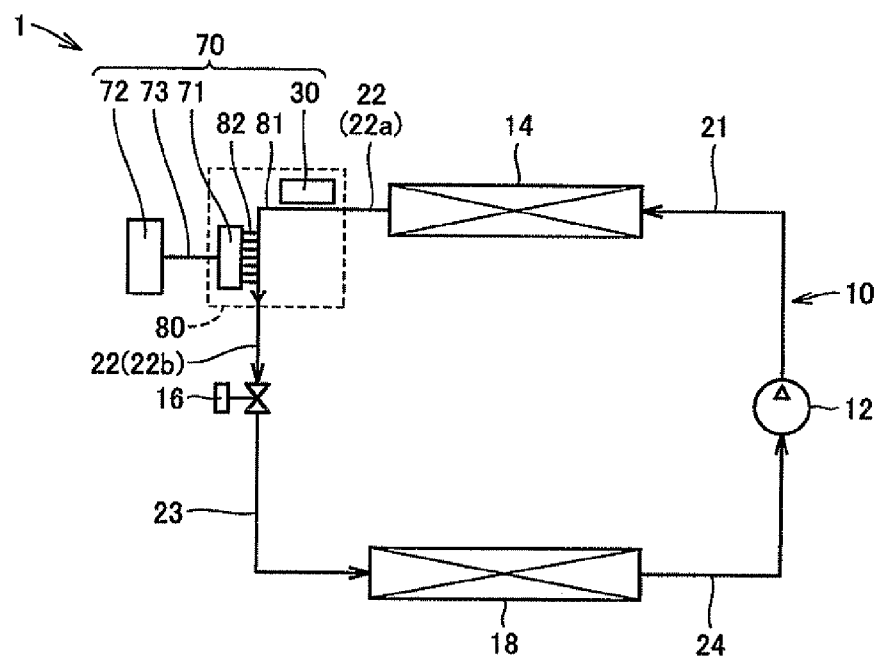
FIG. 5 schematically represents a configuration of a cooling device of a third embodiment.

FIG. 5 schematically represents a configuration of cooling device 1 of the third embodiment. The second embodiment is configured such that charger 71 comes in direct contact with cooling passage 81 allowing the cooling agent to flow. On the other hand, cooling device 1 of the third embodiment includes a heat pipe 82 arranged between charger 71 and cooling passage 81. Heat pipe 82 may be a heat pipe of any known type such as wick-type, thermosiphon-type, and a loop-type.

Charger 71 is connected through heat pipe 82 to an outer peripheral surface of cooling passage 81 forming a path of the cooling agent extending from condenser 14 to evaporator 18 of vapor compression refrigeration cycle 10, and is cooled by heat transfer from charger 71 to cooling passage 81 via heat pipe 82. Since charger 71 is arranged outside of cooling passage 81, charger 71 does not interfere with a flow of the cooling agent flowing in cooling passage 81. Therefore, since the pressure loss of vapor compression refrigeration cycle 10 does not increase, charger 71 can be cooled without increasing the power of compressor 12.

Since charger 71 is used as a heating portion for heat pipe 82, and cooling passage 81 is used as a cooling portion for heat pipe 82, a heat transfer efficiency is enhanced between cooling passage 81 and charger 71, so that a cooling efficiency of charger 71 can be improved. For example, wick-type heat pipe 82 can be used. Since heat pipe 82 can reliably transfer heat from charger 71 to cooling passage 81, charger 71 and cooling passage 81 may be distant, and there is no need to arrange cooling passage 81 intricately to allow cooling passage 81 to be in contact with charger 71. Consequently, the degree of freedom in arrangement of charger 71 can be improved.

Fourth Embodiment

Figure 6:
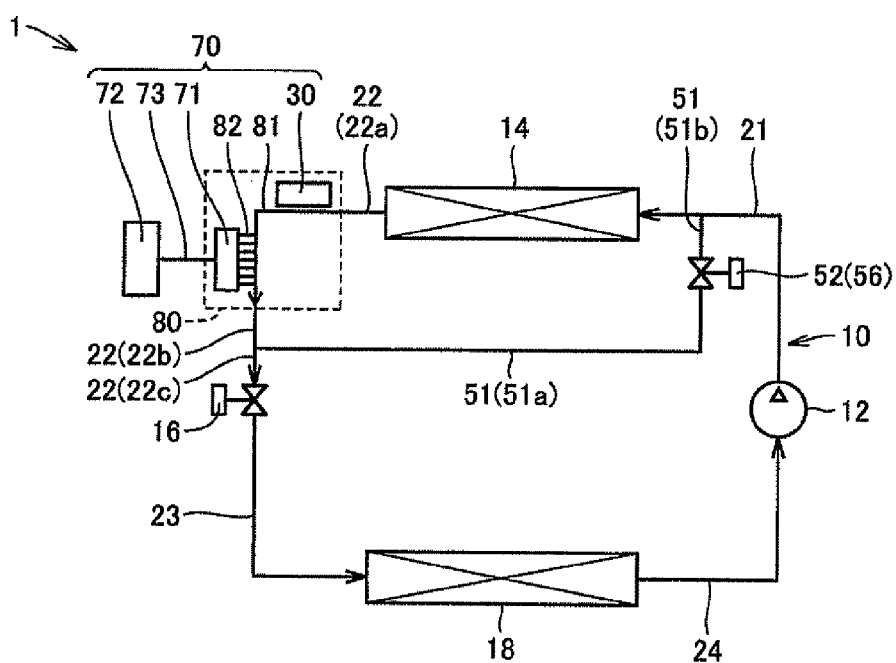
FIG. 6 schematically represents a configuration of a cooling device of a fourth embodiment.

FIG. 6 schematically represents a configuration of cooling device 1 of a fourth embodiment. Cooling device 1 of the fourth embodiment is different from that of the third embodiment in that a communication passage 51 is provided for allowing communication between cooling agent passages 22b, 22c provided on a downstream side from cooling portion 80 and a cooling agent passage 21 provided on an upstream side of condenser 14. Communication passage 51 allows communication between a path of the cooling agent flowing from an outlet of cooling portion 80 to an inlet of expansion valve 16, and a path of the cooling agent flowing from an outlet of compressor 12 to an inlet of condenser 14.

In communication passage 51, a switching valve 52 is provided for switching the flow of cooling agent from cooling agent passage 22b of an outlet of cooling portion 80 to an inlet of expansion valve 16 via cooling agent passage 22c, and the flow of cooling agent from cooling agent passage 22b of the outlet of cooling portion 80 to communication passage 51. Switching valve 52 of the present embodiment is an open-close valve 56. Communication passage 51 is divided into a communication passage 51a provided on an upstream side from open-close valve 56 and a communication passage 51b provided on a downstream side from open-close valve 56.

Changing the open-close states of open-close valve 56 allows the cooling agent flowing through cooling agent passage 22b after cooling charger 71 to flow into expansion valve 16 via cooling agent passage 22c, or into condenser 14 via communication passage 51. Using open-close valve 56 as an example of switching valve 52 to switch the paths of the cooling agent allows the cooling agent after cooling charger 71 to flow selectively to any of a path into expansion valve 16 via cooling agent passages 32b, 22 or a path into condenser 14 via communication passage 51 and cooling agent passage 21.

Figure 7:
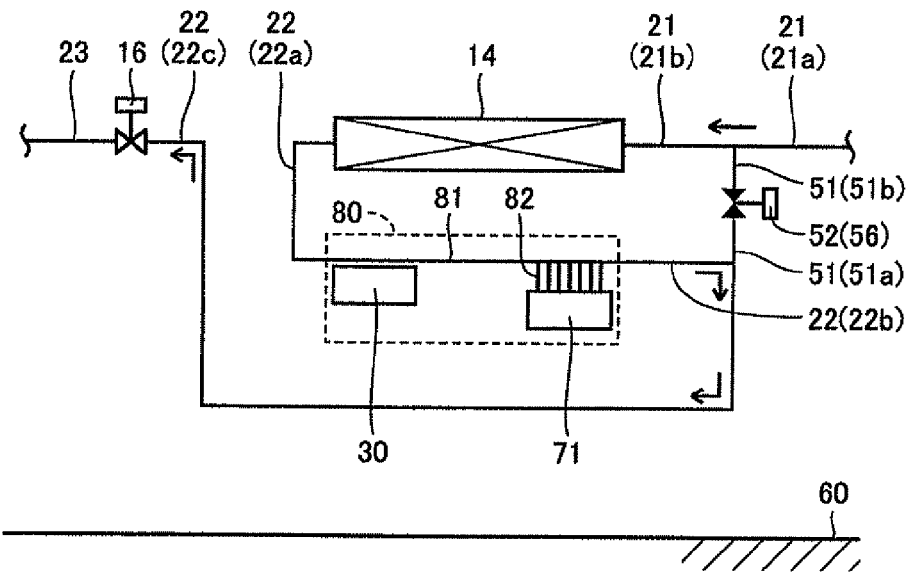
FIG. 7 schematically represents a flow of a cooling agent for cooling a charger during a driven state of a vapor compression refrigeration cycle of the fourth embodiment.

FIG. 7 schematically represents a flow of a cooling agent for cooling charger 71 during a driven state of vapor compression refrigeration cycle 10 of the fourth embodiment. As shown in FIG. 7, when compressor 12 is driven, and vapor compression refrigeration cycle 10 is operated, open-close valve 56 is fully closed (a valve opening degree is 0%) so that the cooling agent flowed through cooling portion 80 to cool charger 71 flows into expansion valve 16 via the cooling agent passages 22b, 22c but not into communication passage 51. Since the path of the cooling agent is selected so that the cooling agent flows entirely in cooling device 1, the ability to cool vapor compression refrigeration cycle 10 can be secured, and charger 71 can be cooled efficiently.

Figure 8:
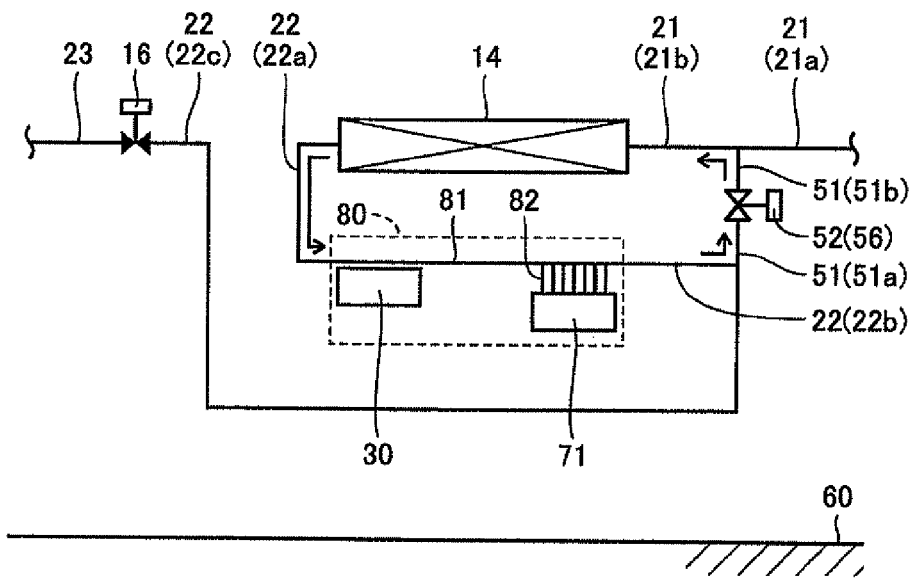
FIG. 8 schematically represents a flow of a cooling agent for cooling a charger during a stopped state of the vapor compression refrigeration cycle of the fourth embodiment.

FIG. 8 schematically represents a flow of a cooling agent for cooling charger 71 during a stopped state of vapor compression refrigeration cycle 10 of the fourth embodiment. As shown in FIG. 8, when compressor 12 is stopped, and vapor compression refrigeration cycle 10 is stopped, open-close valve 56 is fully opened (a valve opening degree is 100%) so as to allow the cooling agent to circulate from cooling portion 80 to condenser 14, and then expansion valve 16 is fully closed (a valve opening degree is 0%). Allowing the cooling agent to circulate via communication passage 51 forms a closed annular path extending from condenser 14 to cooling portion 80 via cooling agent passage 22a and returning to condenser 14 via cooling agent passage 22b, communication passages 51a, 51b, and cooling agent passage 21b sequentially.

The cooling agent can circulate between condenser 14 and cooling portion 80 via the annular passage without operation of compressor 12. The cooling agent receives latent heat of evaporation from charger 71 when cooling charger 71. The cooling agent vapor vaporized in charger 71 flows into condenser 14 via cooling agent passage 22a, communication passage 51, and the cooling agent passage 21b sequentially. In condenser 14, natural draft or forced draft from a cooling fan such as a radiator fan for cooling an engine allows the cooling agent vapor to be cooled and condensed. The cooling agent liquid liquefied in condenser 14 returns to cooling portion 80 via cooling agent passage 22a.

As described above, the annular path extending through charger 71 and condenser 14 forms a heat pipe having charger 71 as a heating portion and condenser 14 as a cooling portion. Therefore, when vapor compression refrigeration cycle 10 is stopped, in other words, when cooling for a vehicle cabin is stopped, the cooling agent is naturally circulated without the need to activate compressor 12, so that charger 71 can be cooled reliably. Since there is no need to continuously operate compressor 12 for cooling charger 71, the power consumption of compressor 12 can be reduced, and additionally compressor 12 can have extended life duration, so that reliability of compressor 12 can be improved.

FIG. 7 and FIG. 8 illustrates a ground 60. In the vertical direction perpendicular to ground 60, cooling portion 80 is arranged below condenser 14. In the annular path for circulating the cooling agent between condenser 14 and charger 71, charger 71 is arranged on a lower side, and condenser 14 is arranged on an upper side. Condenser 14 is arranged at a higher position than charger 71.

In this case, the cooling agent vapor heated and vaporized in charger 71 rises in the annular path and reaches condenser 14, is cooled and condensed in condenser 14 to become a liquid cooling agent, and then goes down the annular path under an action of the gravity to return to charger 71. In other words, a thermosiphon-type heat pipe is formed by charger 71, condenser 14, and a path of the cooling agent connecting those.

Since forming a heat pipe can improve an efficiency of heat transfer from charger 71 to condenser 14, charger 71 can be cooled more efficiently without adding power even when vapor compression refrigeration cycle 10 is stopped.

Fifth Embodiment

Figure 9:
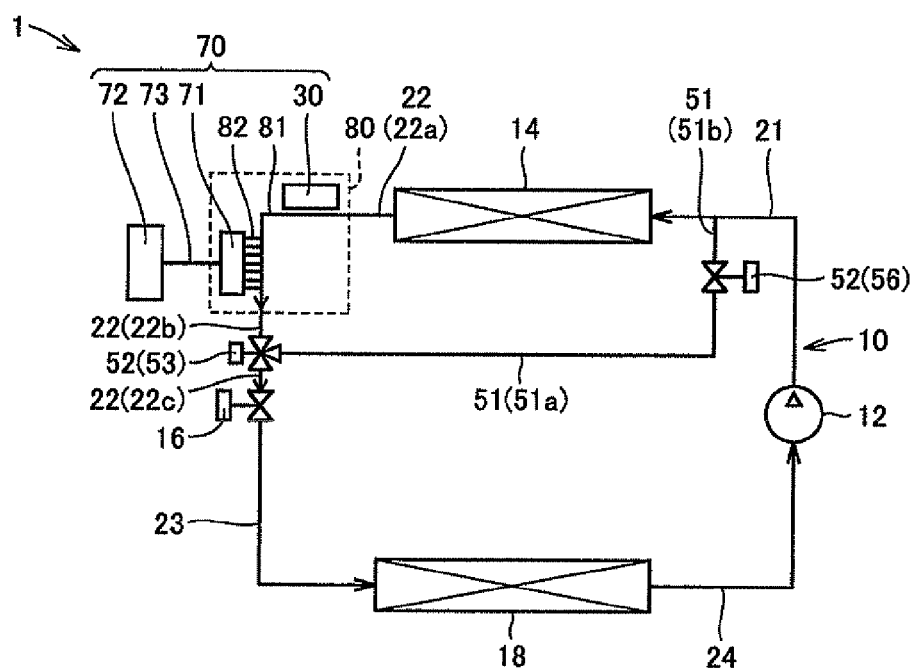
FIG. 9 schematically represents a configuration of a cooling device of a fifth embodiment.
Figure 10:
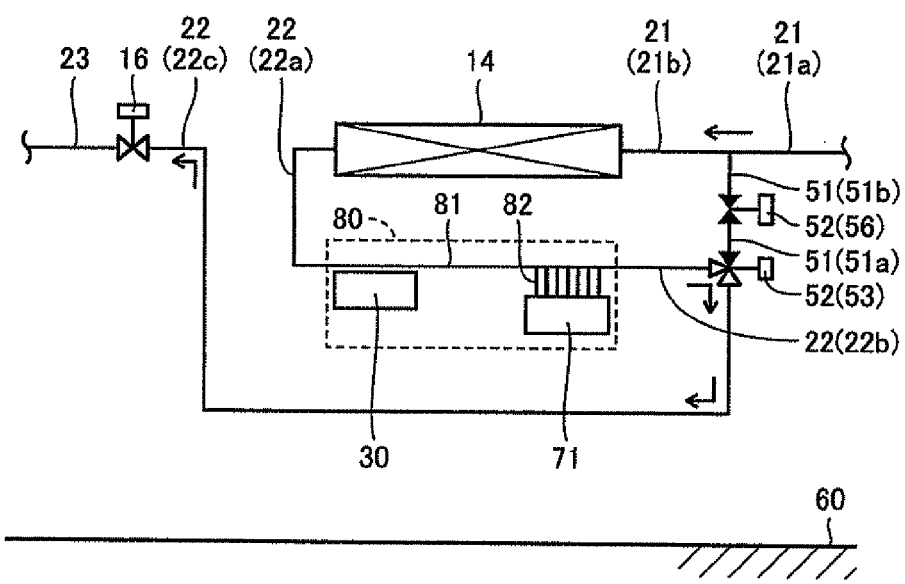
FIG. 10 schematically represents a flow of a cooling agent for cooling a charger during a driven state of a vapor compression refrigeration cycle of the fifth embodiment.
Figure 11:
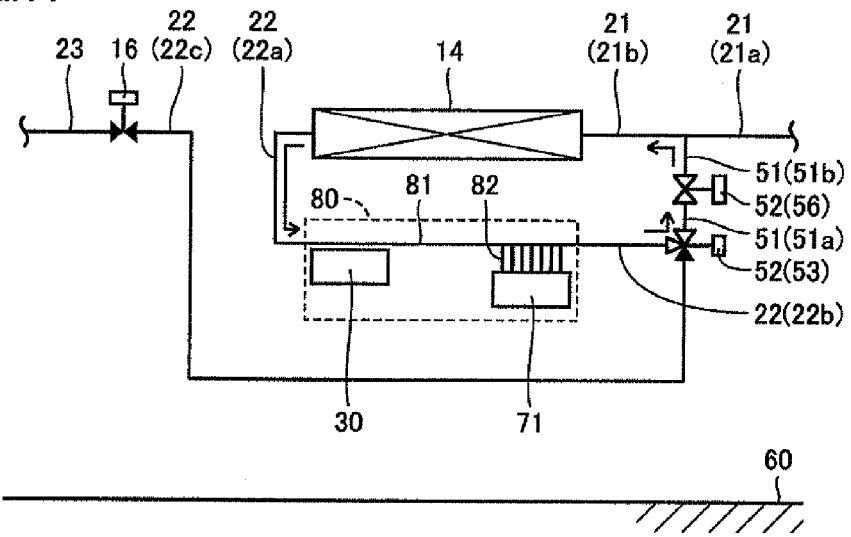
FIG. 11 schematically represents a flow of a cooling agent for cooling a charger during a stopped state of the vapor compression refrigeration cycle of the fifth embodiment.

FIG. 9 schematically represents a configuration of cooling device 1 of the fifth embodiment. FIG. 10 schematically represents a flow of the cooling agent for cooling charger 71 during a driven state of vapor compression refrigeration cycle 10 of the fifth embodiment. FIG. 11 schematically represents a flow of the cooling agent for cooling charger 71 during a stopped state of vapor compression refrigeration cycle 10 of the fifth embodiment. Comparing with the fourth embodiment, cooling device 1 of the fifth embodiment is different in that a three-way valve 53 constituting switching valve 52 is provided. Three-way valve 53 is arranged at a branching point between cooling agent passage 22 and the communication passage 51 to switch communication states of cooling agent passage 22b, cooling agent passage 22c, and communication passage 51a.

When vapor compression refrigeration cycle 10 is operated, open-close valve 56 is fully closed (a valve opening degree is 0%), and on the other hand, three-way valve 53 is operated so as to allow communication between cooling agent passage 22b and cooling agent passage 22c, and disallow communication between communication passage 51a and cooling agent passages 22b, 22c. Accordingly, setting is made such that the cooling agent flowing through cooling portion 80 to cool charger 71 flows into expansion valve 16 via cooling agent passages 22b, 22c, and the cooling agent does not flow into the communication passage 51.

When vapor compression refrigeration cycle 10 is stopped, open-close valve 56 is fully opened (a valve opening degree is 100%), and on the other hand, three-way valve 53 is operated so as to allow communication between cooling agent passage 22b and communication passage 51a, and disallow communication between cooling agent passage 22c and cooling agent passage 22b as well as communication passage 51a. Accordingly, setting is made such that the cooling agent flowing through cooling portion 80 to cool charger 71 circulates from cooling portion 80 to condenser 14, and the cooling agent does not flow into cooling agent passage 22c. Allowing the cooling agent to circulate via communication passage 51 forms a closed annular path extending from condenser 14 to cooling portion 80 via cooling agent passage 22a, and further returning to condenser 14 via cooling agent passage 22b, communication passages 51a, 51b, and the cooling agent passage 21b sequentially.

Arranging three-way valve 53 at a branching point between cooling agent passage 22 and communication passage 51 allows reliable switching between the flow of the cooling agent from cooling agent passage 22b at an outlet of cooling portion 80 to an inlet of expansion valve 16 via cooling agent passage 22c and the flow of the cooling agent from an outlet of cooling portion 80 to communication passage 51 and circulating into condenser 14 can be switched reliably.

Sixth Embodiment

Figure 12:
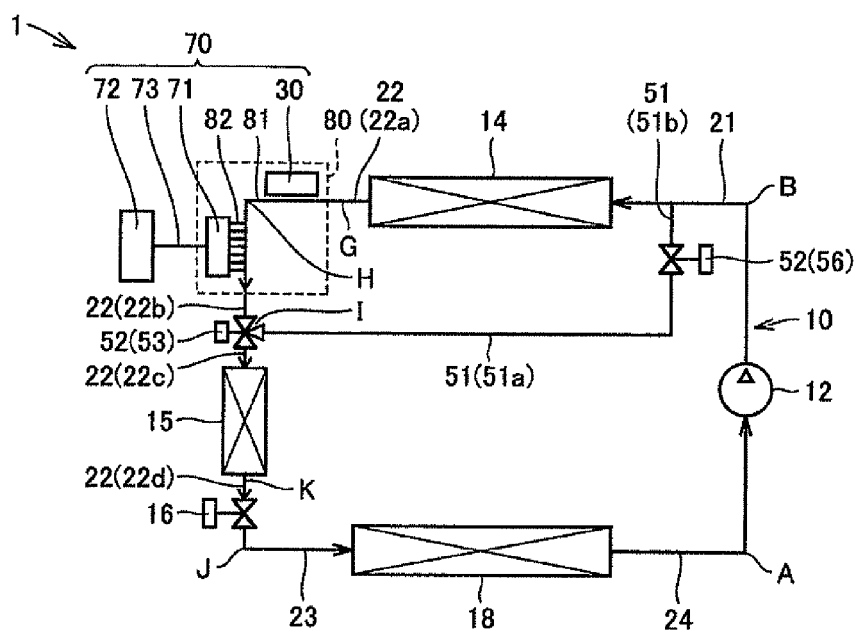
FIG. 12 schematically represents a configuration of a cooling device of a sixth embodiment.

FIG. 12 schematically represents a configuration of cooling device 1 of the sixth embodiment. Cooling device 1 of the sixth embodiment is different from the fifth embodiment in that condenser 15 as another condenser different from condenser 14 is arranged on cooling agent passage 22 coupling between condenser 14 and expansion valve 16 and forming a path of the cooling agent flowing from cooling portion 80 to expansion valve 16.

Cooling device 1 of the sixth embodiment includes condenser 14 as a first condenser, and a condenser 15 as a second condenser. Since cooling portion 80, three-way valve 53, and condenser 15 are provided between condenser 14 and expansion valve 16, cooling agent passage 22 is divided into cooling agent passage 22a provided on an upstream side (side close to condenser 14) from cooling portion, cooling agent passage 22b coupling cooling portion 80 and three-way valve 53, cooling agent passage 22c coupling three-way valve 53 and condenser 15, and cooling agent passage 22d provided on a downstream side (side close to expansion valve 16) from condenser 15. In vapor compression refrigeration cycle 10, the high-pressure cooling agent discharged from compressor 12 is condensed by both condenser 14 and condenser 15.

Figure 13:
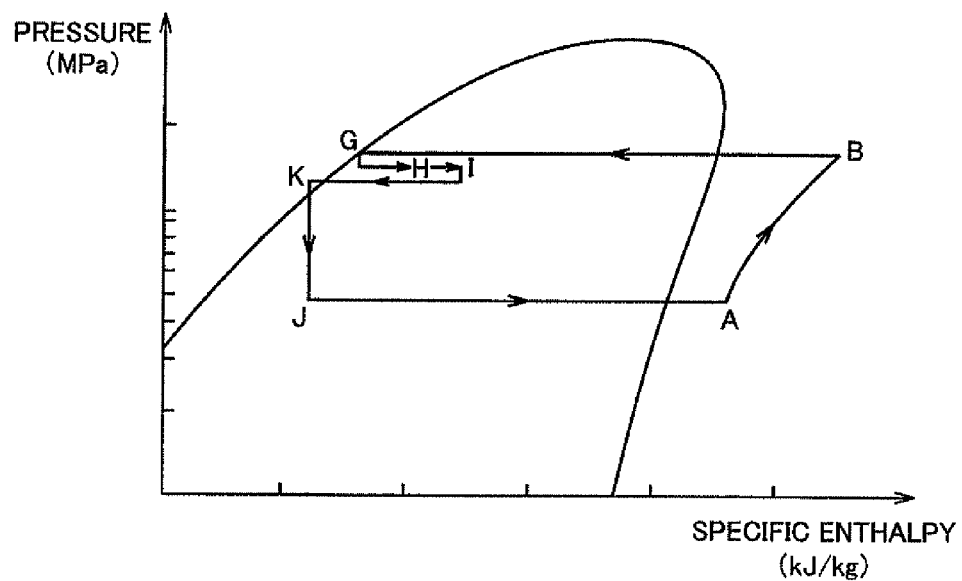
FIG. 13 represents a Mollier chart showing a condition of a cooling agent for a vapor compression refrigeration cycle of the sixth embodiment.

FIG. 13 represents a Mollier chart showing a state of the cooling agent for vapor compression refrigeration cycle 10 of the sixth embodiment. The horizontal axis in FIG. 13 denotes a specific enthalpy (unit: kJ/kg) of the cooling agent, and the vertical axis denotes an absolute pressure (unit: MPa) of the cooling agent. The curve shown in the drawing is a saturated vapor line as well as a saturated liquid line of the cooling agent. FIG. 13 represents a thermal dynamic state of the cooling agent at each point (in other words, the points A, B, G, H, I, K and J) in vapor compression refrigeration cycle 10 shown in FIG. 1.

The Mollier chart showing vapor compression refrigeration cycle 10 of the sixth embodiment is the same as the Mollier chart of the second embodiment shown in FIG. 4, except for the system extending from condenser 14 to expansion valve 16. In other words, the state of the cooling agent flowing from the point I to the point B via the points J and A in the Mollier chart shown in FIG. 4 is the same as the state of the cooling agent flowing from the point K to the point B via the points J and A in the Mollier chart shown in FIG. 13. Therefore, the state of the cooling agent flowing from the point B to the point K particular to vapor compression refrigeration cycle 10 of the sixth embodiment will be described herebelow.

The cooling agent adiabatically compressed by compressor 12 to be in the high-temperature, high-pressure superheated gaseous state is cooled in condenser 14. The cooling agent radiates sensible heat while maintaining the equal pressure, becomes a dry saturated vapor from the superheated vapor, radiates latent heat of condensation and is gradually liquefied to become moist vapor in the gas-liquid mixed state, and becomes saturated liquid after all of the cooling agent is condensed (the point G).

The cooling agent in the state of saturated liquid flowing out from condenser 14 flows into cooling portion 80 from the point G via cooling agent passage 22a. In cooling portion 80, heat is released to liquid cooling agent condensed through condenser 14 to cool HV equipment heat source 30. The heat exchange with HV equipment heat source 30 heats the cooling agent and increases the dryness of the cooling agent. The cooling agent receives latent heat from HV equipment heat source 30 to be partially vaporized, and becomes moist vapor in a mixture of saturated liquid and saturated vapor (H point). Thereafter, the cooling agent is heated further by the heat exchange with charger 71, and the dryness further increases (point I). Radiating the latent heat to the cooling agent cools charger 71.

Thereafter, the cooling agent passes through cooling agent passages 22b, 22c and flows into condenser 15. The moist vapor of the cooling agent is condensed again at condenser 15. When all of the cooling agent is condensed, the moist vapor becomes saturated liquid, and further becomes supercooled liquid which has been supercooled by radiating sensible heat (the point K). Thereafter, the cooling agent passes through expansion valve 16 to become low-temperature, low-pressure moist vapor (the point J).

Sufficiently cooling the cooling agent in condenser 15 allows the cooling agent to have a temperature and a pressure originally required for cooling the vehicle cabin at an outlet of expansion valve 16. Therefore, when the cooling agent is evaporated in evaporator 18, the amount of heat received from outside can be made sufficiently great. As can be seen, determining a heat radiating ability of condenser 15 which can sufficiently cool the cooling agent can cool charger 71 without affecting the cooling ability for cooling the air in the vehicle cabin. Therefore, the ability to cool charger 71 and a cooling ability for the cabin can be both secured reliably.

In vapor compression refrigeration cycle 10 of the second embodiment, condenser 14 is arranged between compressor 12 and expansion valve 16, and the cooling agent is further cooled from the state of saturated liquid in condenser 14, and it was necessary to cool until the cooling agent has a predetermined degree of supercool. When the cooling agent in the state of supercooled liquid is cooled, the temperature of the cooling agent comes close to the atmospheric temperature, so that the cooling efficiency of the cooling agent is lowered. Therefore, increase in the volume of condenser 14 is required. Consequently, there is a problem that condenser 14 is increased in its size to be disadvantageous as cooling device 1 for a vehicle. On the other hand, miniaturizing the condenser 14 for mounting to a vehicle causes the heat radiating ability of condenser 14 to be small. Consequently, the temperature of the cooling agent at an outlet of expansion valve 16 cannot be lowered sufficiently, so that cooling ability for the cabin becomes likely to be insufficient.

On the other hand, according to vapor compression refrigeration cycle 10 of the sixth embodiment, two condensers 14, 15 are arranged between compressor 12 and expansion valve 16, and cooling portion 80 as a cooling system for charger 71 is provided between condenser 14 and condenser 15. In condenser 14, as can be seen in FIG. 13, it is sufficient to cool the cooling agent to the state of saturated liquid. The cooling agent having received latent heat of evaporation from charger 71 and partially vaporized is cooled again in condenser 15. The state of the cooling agent is changed at a constant temperature until the cooling agent in the state of moist vapor is condensed to completely become saturated liquid. Condenser 15 further cools the cooling agent to the degree of supercool necessary for cooling the vehicle cabin. Therefore, as compared to the first embodiment, the volume of condensers 14, 15 can be reduced without the need to increase the degree of supercool of the cooling agent. Therefore, the sizes of condensers 14, 15 can be reduced, so that cooling device 1 which is miniaturized to be advantageous for mounting on a vehicle can be obtained.

The cooling agent flowing from condenser 14 into cooling portion 80 via cooling agent passage 22 receives heat from charger 71 to be heated when cooling charger 71. When all of the cooling agent heated in charger 71 is vaporized and becomes dry vapor, the amount of heat exchange between the cooling agent and charger 71 is reduced and charger 71 cannot be cooled sufficiently, and the pressure loss increases when the cooling agent flows into the pipe. Therefore, it is preferable to cool the cooling agent sufficiently in condenser 14 to an extent of not allowing the cooling agent after cooling the charger 71 to become dry vapor.

Specifically, the state of the cooling agent at an outlet of condenser 14 is allowed to be close to the saturated liquid, and the cooling agent is typically allowed to be in the state on the saturated liquid line at an outlet of condenser 14. As a result of allowing condenser 14 to have an ability to sufficiently cool cooling agent, the heat radiating ability of condenser 14 to radiate heat from the cooling agent becomes higher than the heat radiating ability of condenser 15. Allowing the cooling agent to be cooled sufficiently in condenser 14 having a relatively greater heat radiating ability can retain the cooling agent having received heat from charger 71 to be in the state of moist vapor, so that the reduction in the amount of heat exchange between the cooling agent and charger 71 can be avoided. Therefore, charger 71 can be cooled sufficiently and efficiently. The state of the cooling agent of the vapor moist after cooling the charger 71 is efficiently cooled again in condenser 15, and cooled to a state of supercooled liquid to an extent slightly below the saturated temperature. Therefore, cooling device 1 can be provided which can secure both the cooling ability for the vehicle cabin and the cooling ability for charger 71.

Seventh Embodiment

Figure 14:
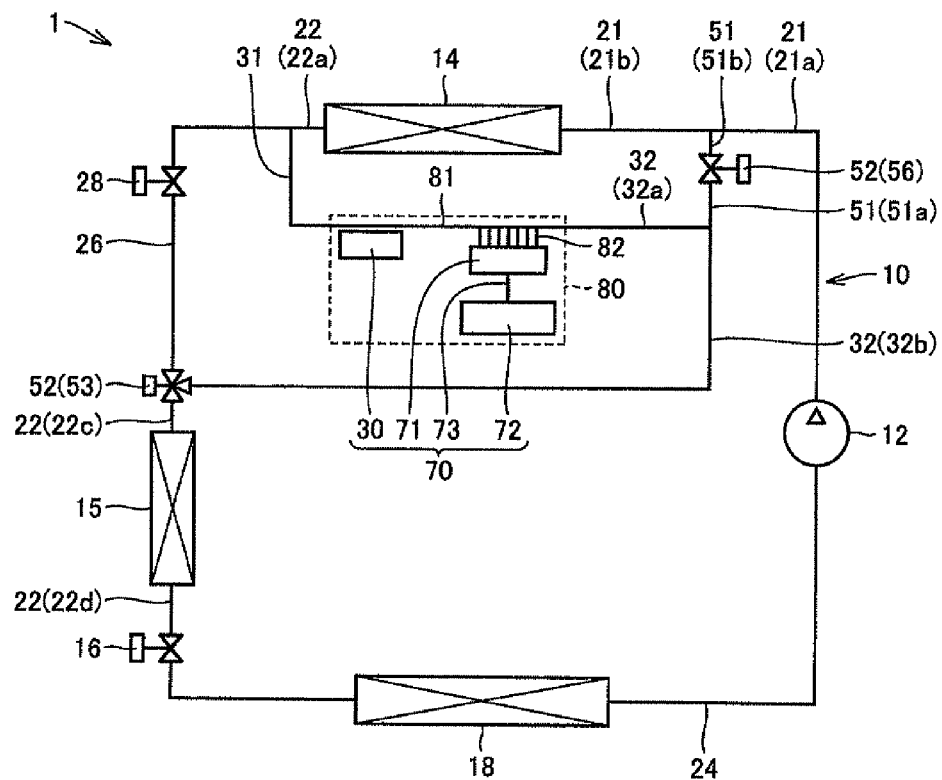
FIG. 14 schematically represents a configuration of a cooling device of a seventh embodiment.

FIG. 14 schematically represents a configuration of cooling device 1 of the seventh embodiment. In cooling device 1 of the seventh embodiment, cooling agent passage 22 allowing the cooling agent to flow from an outlet of condenser 14 to an inlet of expansion valve 16 includes a passage forming portion 26 as a first passage. Passage forming portion 26 forms a part of cooling agent passage 22. Cooling agent passage 22 between condenser 14 and expansion valve 16 is divided into cooling agent passage 22a provided on an upstream side (side close to condenser 14) from passage forming portion 26, passage forming portion 26, cooling agent passage 22c extending from passage forming portion 26 to condenser 15, and cooling agent passage 22d provided on a downstream side (side close to expansion valve 16) of condenser 15.

Cooling device 1 includes another cooling agent passage as a second passage arranged in parallel with passage forming portion 26. The another passage for the cooling agent includes cooling agent passages 31, 32, and cooling passage 81 for cooling portion 80. Cooling portion 80 is provided on the another passage for the cooling agent. The cooling agent flowing via cooling agent passages 31, 32 flows via cooling portion 80, and takes heat from HV equipment heat source 30 and charger 71 as heat sources to cool HV equipment heat source 30 and charger 71. Cooling agent passage 31 is a passage for allowing the cooling agent to flow from cooling agent passage 22a to cooling portion 80. Cooling agent passage 32 is a passage for allowing the cooling agent to flow from cooling portion 80 to cooling agent passage 22c. The cooling agent flows from cooling agent passage 22a to cooling portion 80 via cooling agent passage 31, and flows from cooling portion 80 to cooling passage 22c via cooling agent passage 32. A high pressure liquid cooling agent left from condenser 14 is branched out, and a part of the cooling agent flows to cooling portion 80.

As a path of the cooling agent flowing from an outlet of condenser 14 to an inlet of expansion valve 16, cooling agent passages 31, 32 as well as cooling passage 81 as passages passing through cooling portion 80, and passage forming portion 26 as a passage not passing through cooling portion 80 are provided in parallel. Therefore, only a part of the cooling agent flowing out from condenser 14 flows into cooling portion 80. The cooling agent with an amount necessary for cooling charger 71 in cooling portion 80 is allowed to flow into cooling agent passages 31, 32, so that charger 71 is cooled appropriately. Thus, excessive cooling of charger 71 can be prevented. Since not all of the cooling agent flows into cooling portion 80, the pressure loss related to the flow of cooling agent in cooling agent passages 31, 32 can be reduced, and with that, the power consumption required for operation of compressor 12 for circulating the cooling agent can be reduced.

Passage forming portion 26 forming a part of cooling agent passage 22 is provided between condenser 14 and condenser 15 of cooling agent passage 22. The cooling system of charger 71 including cooling agent passages 31, 32 is connected in parallel with passage forming portion 26. The path of the cooling agent flowing directly from condenser 14 to condenser 15, and the path of the cooling agent flowing from condenser 14 to condenser 15 via cooling portion 80 are provided in parallel, and only a part of the cooling agent is allowed to flow into cooling agent passages 31, 32, so that the loss of pressure can be reduced when the cooling agent flows into the cooling system of charger 71.

Cooling device 1 further includes a flow rate adjusting valve 28. Flow rate adjusting valve 28 is provided on cooling agent passage 22 extending from condenser 14 to expansion valve 16. Flow rate adjusting valve 28 is arranged on passage forming portion 26 forming a part of cooling agent passage 22. Flow rate adjusting valve 28 changes its valve opening degree to increase and reduce the pressure loss of the cooling agent flowing through passage forming portion 26, so that a flow rate of the cooling agent flowing through passage forming portion 26 and a flow rate of the cooling agent flowing through cooling agent passages 31, 32 and cooling passage 81 are adjusted optionally.

For example, when flow rate adjusting valve 28 is fully closed to attain a valve opening degree of 0%, all of the amount of cooling agent left from condenser 14 flows into cooling agent passage 31. When the valve opening degree of flow rate adjusting valve 28 is set greater, among the cooling agent flowing into condenser 14 and to cooling agent passage 22, the flow rate of passage forming portion 26 is set greater, so that the flow rate of the cooling agent flowing through cooling agent passages 31, 32 and cooling passage 81 to cool charger 71 becomes small. When the valve opening degree of flow rate adjusting valve 28 is set smaller, among the flow of the cooling agent from condenser 14 to cooling agent passage 22, the flow rate of the cooling agent directly flowing into condenser 15 via passage forming portion 26 becomes smaller, so that the flow rate of the cooling agent flowing into cooling portion 80 via cooling agent passages 31, 32 and cooling passage 81 to cooling charger 71 becomes greater.

When the valve opening degree of flow rate adjusting valve 28 is set greater, the flow rate of the cooling agent for cooling charger 71 becomes smaller, so that the cooling ability of charger 71 is lowered. When the valve opening degree of flow rate adjusting valve 28 is set smaller, the flow rate of the cooling agent for cooling charger 71 becomes greater, so that the ability for cooling charger 71 is improved. Since the amount of the cooling agent flowing into cooling portion 80 can be appropriately adjusted using flow rate adjusting valve 28, excessive cooling of charger 71 can be prevented, and in addition, the pressure loss related to the flow of the cooling agent in cooling agent passages 31, 32 and the power consumption of compressor 12 for circulating the cooling agent can be reduced reliably.

Figure 15:
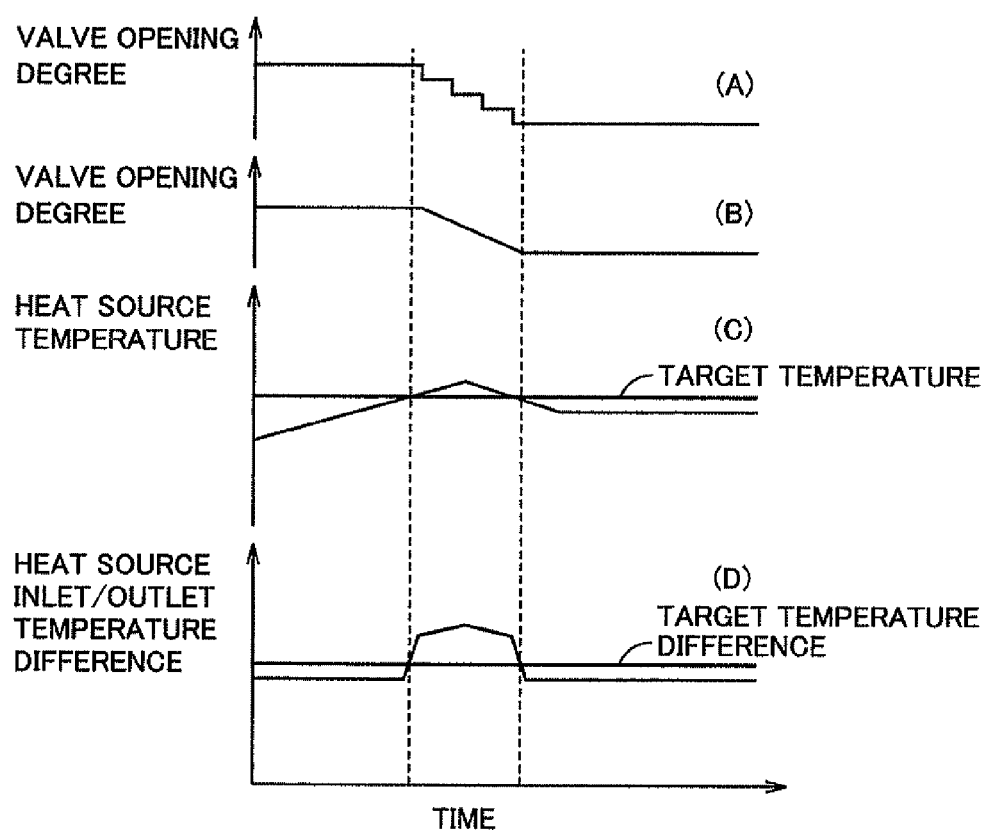
FIG. 15 represents an outline of an opening degree control of a flow rate adjusting valve.

An example of a control related to the adjustment of the valve opening degree of flow rate adjusting valve 28 will be described herebelow. FIG. 15 represents an outline of an opening degree control for flow rate adjusting valve 28. The horizontal axis in the graphs (A)-(D) in FIG. 15 denotes time. The vertical axis in the graph (A) denotes a valve opening degree in the case where flow rate adjusting valve 28 is an electric expansion valve using a stepping motor. The vertical axis in the graph (B) denotes a valve opening degree in the case where flow rate adjusting valve 28 is a thermostatic expansion valve operated to open and close in accordance with the change in temperature. The vertical axis in the graph (C) denotes the temperature of the charger 71 as a heat source. The vertical axis of the graph (D) denotes the temperature difference between an outlet and an inlet of charger 71.

The cooling agent flows into cooling portion 80 via cooling agent passages 31, 32, so that charger 71 is cooled. The adjustment of the opening degree of flow rate adjusting valve 28 is performed, for example, by monitoring the temperature of charger 71 or the temperature difference between outlet temperature and inlet temperature of charger 71. For example, with reference to the graph (C), a temperature sensor for continuously measuring the temperature of charger 71 is provided to monitor the temperature of charger 71. Further, for example, with reference to the graph (D), a temperature sensor for measuring an inlet temperature and an outlet temperature of charger 71 is provided to monitor the temperature difference between the outlet and the inlet of charger 71.

When the temperature of the charger 71 is over the target temperature, or when the temperature difference between the inlet and outlet of charger 71 is over the target temperature difference (for example, 3-5° C.), the opening degree of flow rate adjusting valve 28 is set smaller, as can be seen in the graph (A) and the graph (B). Narrowing down the opening degree of flow rate adjusting valve 28 causes the flow rate of the cooling agent flowing into cooling portion 80 via cooling agent passage 31 becomes greater as described above, so that charger 71 can be cooled more effectively. Consequently, the temperature of charger 71 can be lowered to be less than or equal to the target temperature as can be seen in the graph (C), or the temperature difference between outlet and inlet of charger 71 can be set smaller to achieve the temperature less than or equal to the target temperature difference as can be seen in the graph (D).

As described above, by adjusting the valve opening degree of flow rate adjusting valve 28 appropriately, the amount of cooling agent which can obtained a heat radiating ability required to maintain charger 71 within an appropriate temperature range is secured, so that charger 71 can be cooled appropriately. Therefore, generation of malfunction that charger 71 is damaged due to overheat can be suppressed reliably.

Referring back to FIG. 14, cooling device 1 of the seventh embodiment includes communication passage 51 allowing communication between a cooling agent passage 32 as a path for the cooling agent flowing from cooling portion 80 to condenser 15 and a cooling agent passage 21 as a path for the cooling agent flowing from compressor 12 to condenser 14. Cooling agent passage 32 is divided into cooling agent passage 32a provided on an upstream side from the branching point of communication passage 51, and cooling agent passage 32b provide on a downstream side from the branching point of communication passage 51. Cooling agent passage 21 is divided into cooling agent passage 21a provided on an upstream side from the branching point of communication passage 51 and cooling agent passage 21b provided on a downstream side from the branching point of communication passage 51.

Communication passage 51 is provided with open-close valve 56. Three-way valve 53 is arranged at a branching point between passage forming portion 26, cooling agent passage 22c, and cooling agent passage 32b. Three-way valve 53 and open-close valve 56 serve as switching valve 52 for switching the flow of the cooling agent. By changing the open-close states of open-close valve 56 and three-way valve 53, the cooling agent flowing through cooling agent passage 32a after cooling the charger 71 can flow into condenser 15 via cooling agent passage 32b, or flow into condenser 14 via communication passage 51. By switching the path of the cooling agent using three-way valve 53 and open-close valve 56, the cooling agent after cooling charger 71 can flow into condenser 15 via cooling agent passages 32b, 22c, or into condenser 14 via communication passage 51 and cooling agent passage 21b, selectively.

Figure 16:
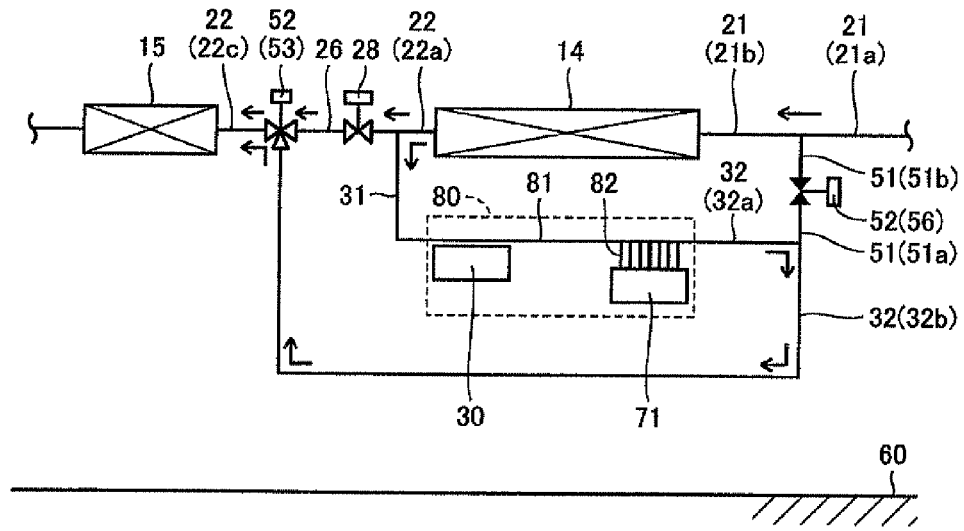
FIG. 16 schematically represents a flow of a cooling agent for cooling a charger during a driven state of a vapor compression refrigeration cycle of the seventh embodiment.

FIG. 16 schematically represents a flow of the cooling agent for cooling charger 71 during a driven state of vapor compression refrigeration cycle 10 of the seventh embodiment. As shown in FIG. 16, when vapor compression refrigeration cycle 10 is operated, open-close valve 56 is fully closed (valve opening degree is 0%), and three-way valve 53 is fully opened (valve opening degree is 100%) at all of the paths, so that the cooling agent flowing through cooling portion 80 to cool charger 71 flows into condenser 15 via cooling agent passages 32b, 22c, and the cooling agent does not flow into communication passage 51.

Figure 17:
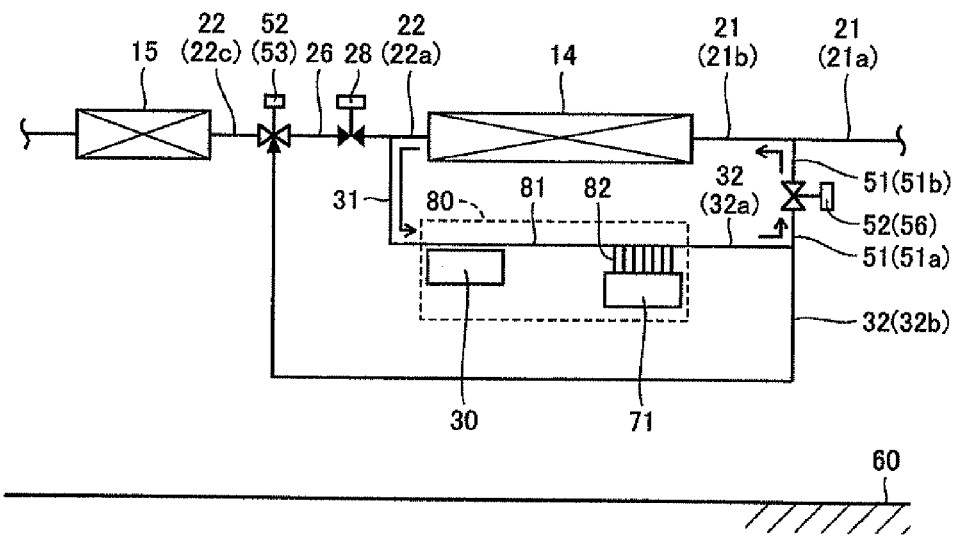
FIG. 17 schematically represents a flow of a cooling agent for cooling a charger during a stopped state of a vapor compression refrigeration cycle of the seventh embodiment.

FIG. 17 schematically represents a flow of a cooling agent for cooling charger 71 during a stopped state of vapor compression refrigeration cycle 10 of the seventh embodiment. As shown in FIG. 17, when vapor compression refrigeration cycle 10 is stopped, open-close valve 56 is fully opened (valve opening degree is 100%), and expansion valve 16 is fully closed (valve opening degree is 0%), and three-way valve 53 is further operated to disallow communication between cooling agent passage 32b and cooling agent passage 22c, so that the cooling agent flows in the circulate from cooling portion 80 to condenser 14. By allowing the cooling agent to circulate via communication passage 51, a closed annular passage is formed which extends from condenser 14 to cooling portion 80 via cooling agent passages 22a, 31 and returns to condenser 14 via cooling agent passage 32a, communication passages 51a, 51b, and cooling agent passage 21b sequentially.

The cooling agent can circulate between condenser 14 and cooling portion 80 via the annular path without operating compressor 12. The cooling agent receives latent heat of evaporation from charger 71 to be evaporated when cooling charger 71. The cooling agent vapor vaporized in charger 71 flows into condenser 14 via cooling agent passage 32a, communication passages 51a, 51b, and cooling agent passage 21b. In condenser 14, the cooling agent vapor is cooled and condensed by natural draft or forced draft from a cooling fan such as an engine cooling radiator fan. Cooling agent liquid liquefied in condenser 14 returns to cooling portion 80 via cooling agent passages 22a, 31.

As described above, the annular passage extending through charger 71 and condenser 14 forms a heat type having charger 71 as a heating portion and condenser 14 as a cooling portion. Therefore, even when vapor compression refrigeration cycle 10 is stopped, in other words, when the cooling for a vehicle cabin is stopped, charger 71 can be cooled reliably without the need to activate compressor 12. Since there is no need to continuously operate compressor 12 to cool charger 71, power consumption of compressor 12 can be reduced, and in addition, the duration of compressor 12 can be lengthened, so that reliability of compressor 12 can be improved.

Eighth Embodiment

Figure 18:
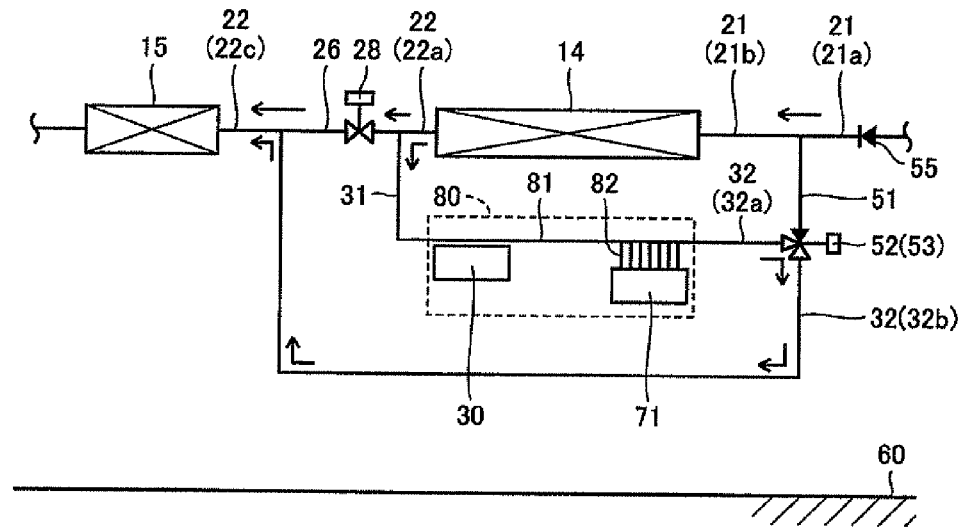
FIG. 18 schematically represents a configuration of a cooling device of an eighth embodiment and a flow of a cooling agent for cooling a charger during a driven state of a vapor compression refrigeration cycle.
Figure 19:
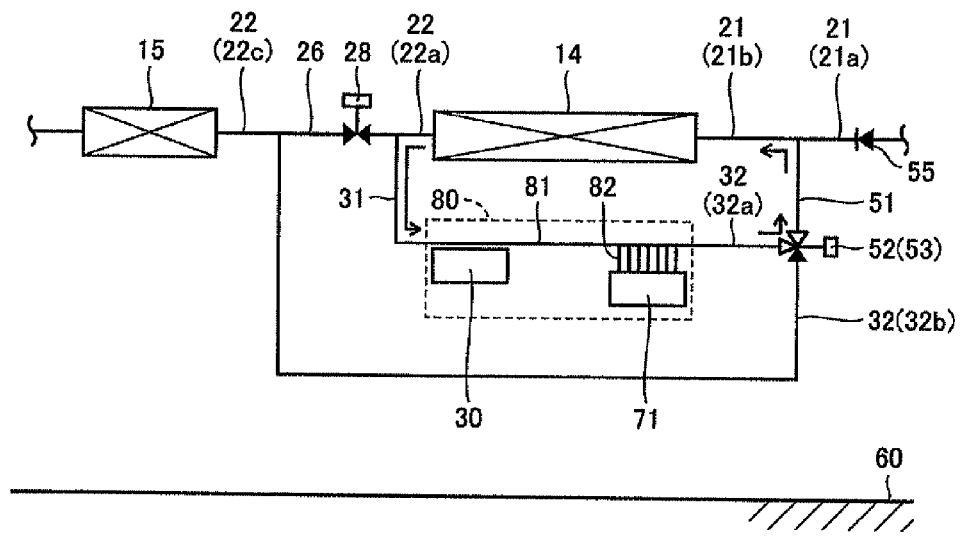
FIG. 19 schematically represents a configuration of a cooling device of the eighth embodiment and a flow of a cooling agent for cooling a charger during a stopped state of the vapor compression refrigeration cycle.

FIG. 18 schematically represents a configuration of cooling device 1 of an eighth embodiment and a flow of the cooling agent for cooling charger 71 during a driven state of vapor compression refrigeration cycle 10. FIG. 19 schematically represents a configuration of cooling device 1 of the eighth embodiment and a flow of the cooling agent for cooling charger 71 during a stopped state of vapor compression refrigeration cycle 10. As compared with the configuration of seventh embodiment shown in FIGS. 16 and 17, in cooling device 1 of the eighth embodiment, three-way valve 53 serving as a switching valve 52 is arranged at a branching point between cooling agent passage 32 and communication passage 51, and open-close valve 56 is removed.

As shown in FIG. 18, during a driven state of vapor compression refrigeration cycle 10, three-way valve 53 is operated so that cooling agent passages 32a, 32b are allowed to communicate, and cooling agent passage 32 and communication passage 51 are disallowed to communicate, and a valve opening degree of flow rate adjusting valve 28 is adjusted so as to allow a sufficient amount of cooling agent to flow into cooling portion 80. Accordingly, the cooling agent after cooling charger 71 can flow into condenser 15 reliably via cooling agent passages 32a, 32b, 32c. On the other hand, as shown in FIG. 19, during the stopped state of vapor compression refrigeration cycle 10, three-way valve 53 is operated so that cooling agent passage 32a and communication passage 51 are allowed to communicate, and cooling agent passages 31a and 31b are disallowed to communicate, and flow rate adjusting valve 28 is fully closed. Accordingly, an annular path can be formed which allows the cooling agent to circulate between charger 71 and condenser 14.

As switching valve 52 for switching communication states of cooling agent passage 32 and cooling agent passages 21, 22, any of the valves shown in the seventh and eighth embodiments may be provided. Alternatively, any other valve may be provided as long as it has a configuration such that the cooling agent is allowed to flow into cooling portion 80 to efficiently cool charger 71 in both of the operated state and the stopped state of vapor compression refrigeration cycle 10. Comparing with the seventh embodiment, in the configuration of the eight embodiment, one open-close valve 56 is omitted. Therefore, it is considered that the space required for arrangement of switching valve 52 may be small, so that cooling device 1 being more miniaturized and having exhibiting superior vehicle mountability may be provided.

Cooling device 1 of the eighth embodiment further includes a check valve 55. Check valve 55 is arranged at cooling agent passage 21 between compressor 12 and condenser 14, specifically at cooling agent passage 21a on a side closer to compressor 12 than the connection part between cooling agent passage 21 and communication passage 51. Check valve 55 permits a flow of the cooling agent from the compressor 12 to condenser 14, and prohibits the flow of the cooling agent in the opposite direction.

With such a configuration, as shown in FIG. 19, when flow rate adjusting valve 28 is fully closed (valve opening degree is 0%) and three-way valve 53 is adjusted such that the cooling agent flows from cooling agent passage 32a to communication passage 51 and does not flow into the cooling agent passage 32b, the path of the cooling agent in a closed loop-like cooling agent path circulating the cooling agent between condenser 14 and HV equipment heat source 30 can be formed reliably.

When check valve 55 is not provided, the cooling agent is likely to flow from communication passage 51 to cooling agent passage 21a on a side of compressor 12. Providing check valve 55 can reliably prohibit the flow of cooling agent from communication passage 51 to compressor 12, so that lowering of the cooling ability of charger 71 in the stopped state of vapor compression refrigeration cycle 10 using a heat pipe formed with the annular cooling agent passage can be prevented. Therefore, when the cooling in the cabin of the vehicle is stopped, charger 71 can be cooled efficiently.

Further, when the amount of cooling agent in the passage of the cooling agent having a closed loop-like shape becomes insufficient in the stopped state of vapor compression refrigeration cycle 10, cooling agent can be supplied to the closed loop path via check valve 55 by driving compressor 12 for only a short period of time. Accordingly, the amount of cooling agent in the closed loop can be increased and the amount of heat exchange process of heat pipe can be increased. Therefore, the amount of cooling agent in the heat pipe can be secured, and insufficiency of cooling charger 71 due to lack of the amount of cooling agent can be avoided.

The embodiments of the present invention have been described above, but the configuration of each embodiment can be combined appropriately. Further, the embodiments disclosed herein are illustrative and non-restrictive. The scope of the present invention is defined by the terms of claims, rather than the description set forth above, and is intended to include any modifications within the scope an meaning equivalent to the terms of the claims.

INDUSTRIAL APPLICABILITY

The cooling device of the present invention may be applied particularly advantageous for cooling of a charger using vapor compression refrigeration cooling for a cabin in a vehicle provided with a charger for charging with reception of power supply from an external power source for a battery capable of charging and discharging, such as a plug-in hybrid vehicle and an electric vehicle.

REFERENCE SIGNS LIST 1 cooling device; 10 vapor compression refrigeration cycle; 12 compressor; 14, condenser; 16 expansion valve; 18 evaporator; 21, 21a, 21b, 22, 22a, 22b, 22c, 22d, 23, 23a, 23b, 24, 31, 31a, 31b, 32, 32a, 32b cooling agent passage; 26 passage forming portion; 28 flow rate adjusting valve; 30 HV equipment heat source; 51, 51a, 51b communication passage; 52 switching valve; 53 three-way valve; 55 check valve; 56 open-close valve; 60 ground; 71 charger; 72 battery; 73 wiring; 80 cooling portion; 81 cooling passage; 82 heat pipe

The invention claimed is:

1. A cooling device for cooling a charger for charging a battery with use of power supply received from a power source, comprising:
   a compressor for circulating a cooling agent;
   a condenser for condensing said cooling agent;
   a decompressor for decompressing said cooling agent condensed by said condenser;
   an evaporator for evaporating said cooling agent decompressed by said decompressor;
   a cooling portion for cooling said charger with use of said cooling agent flowing from said condenser, said cooling portion being provided on a path of the said cooling agent flowing from said condenser to said decompressor; and
   a communication passage for allowing communication between a path of said cooling agent flowing from said cooling portion to said decompressor and a path of said cooling agent flowing from said compressor to said condenser
   said cooling portion being arranged below said condenser.

2. The cooling device according to claim 1, wherein said charger comes in direct contact with a pipe allowing said cooling agent to flow.

3. The cooling device according to claim 1, further comprising:
   a heat pipe arranged between said charger and a pipe allowing said cooling agent to flow.

4. The cooling device according to claim 1, further comprising:
   another condenser provided on a path of said cooling agent flowing from said cooling portion to said decompressor.

5. The cooling device according to claim 4, wherein said condenser has a higher heat radiating ability of radiating heat from said cooling agent than that of said another condenser.

6. The cooling device according to claim 1, further comprising:
   a first passage and a second passage arranged in parallel allowing said cooling agent to flow from an outlet of said condenser to an inlet of said decompressor, and
   said cooling said cooling portion is provided on said second passage.

7. The cooling device according to claim 6, further comprising:
   a flow rate adjusting valve arranged on said first passage to adjust a flow rate of said cooling agent flowing through said first passage and a flow rate of said cooling agent flowing through said second passage.

8. The cooling device according to claim 1, further comprising:
   a switching valve for switching a flow of said cooling agent from an outlet of said cooling portion to an inlet of said decompressor and a flow of said cooling agent from the outlet of said cooling portion to said communication passage.

9. The cooling device according to claim 1, wherein said cooling portion includes electric equipment arranged on an upstream side from said charger on the flow of said cooling agent, and said cooling portion uses said cooling agent flowing from said condenser to cool said electric equipment.

* * * * *